(12) United States Patent
Furutani (10) Patent No.: US 11,706,905 B2
(45) Date of Patent: Jul. 18, 2023

(54) MODULE

(71) Applicant: Murata Manufacturing Co., Ltd., Kyoto (JP)

(72) Inventor: Koji Furutani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 23 days.

(21) Appl. No.: 17/151,962

(22) Filed: Jan. 19, 2021

(65) Prior Publication Data
US 2021/0144880 A1    May 13, 2021

Related U.S. Application Data

(63) Continuation of application No. PCT/JP2019/028070, filed on Jul. 17, 2019.

(30) Foreign Application Priority Data

Jul. 20, 2018 (JP) ................. 2018-136485

(51) Int. Cl.
*H01L 23/14* (2006.01)
*H05K 7/20* (2006.01)
*H05K 1/11* (2006.01)

(52) U.S. Cl.
CPC ............. *H05K 7/209* (2013.01); *H01L 23/14* (2013.01); *H05K 1/11* (2013.01); *H05K 2201/0355* (2013.01)

(58) Field of Classification Search
None
See application file for complete search history.

(56) References Cited

U.S. PATENT DOCUMENTS 7,478,474 B2 *  1/2009  Koga .................. H01L 23/3121
                                                            29/841
9,137,934 B2 *  9/2015  Morris .................... H05K 3/284
(Continued)

FOREIGN PATENT DOCUMENTS

JP    2017045932 A    3/2017
WO    2004010499 A1   1/2004
(Continued)

OTHER PUBLICATIONS

International Search Report issued in Application No. PCT/JP2019/028070, dated Oct. 8, 2019.
(Continued)

*Primary Examiner* — Courtney L Smith
(74) *Attorney, Agent, or Firm* — Pearne & Gordon LLP (57) ABSTRACT

A module includes a substrate, which has a polygonal shape in a plan view, an electronic component and an electronic component, which are mounted on a main surface of the substrate, and side electrodes, which are provided on at least two side surfaces of a plurality of side surfaces that form the polygonal shape of the substrate. A conductor film coupled to the electronic component and a conductor film coupled to the electronic component are provided on the substrate. The conductor film extends to reach a side surface of the at least two side surfaces to be coupled to a side electrode provided on the side surface. The conductor film extends to reach a side surface of the at least two side surfaces, which is different from the side surface, to be coupled to a side electrode provided on the side surface.

19 Claims, 7 Drawing Sheets

(56) References Cited

U.S. PATENT DOCUMENTS

| | | | |
|---|---|---|---|
| 9,953,937 B2* | 4/2018 | Ishibashi | H01L 23/66 |
| 10,535,581 B2* | 1/2020 | Fujinaga | H01L 23/3121 |
| 10,593,480 B2* | 3/2020 | Yamamoto | H01L 28/40 |
| 10,706,993 B2* | 7/2020 | Shimoichi | H01L 28/20 |
| 2004/0178500 A1* | 9/2004 | Usui | H01L 24/97 |
| | | | 257/734 |
| 2004/0232452 A1 | 11/2004 | Tsuneoka et al. | |
| 2017/0256474 A1 | 9/2017 | Fujinaga | |
| 2017/0323838 A1* | 11/2017 | Otsubo | H01L 21/561 |

FOREIGN PATENT DOCUMENTS

| | | | |
|---|---|---|---|
| WO | 2016080333 A1 | 5/2016 | |
| WO | 2016121491 A1 | 8/2016 | |

OTHER PUBLICATIONS

Written Opinion issued in Application No. PCT/JP2019/028070, dated Oct. 8, 2019.

* cited by examiner

MODULE

CROSS REFERENCE TO RELATED APPLICATION

This is a continuation of International Application No. PCT/JP2019/028070 filed on Jul. 17, 2019 which claims priority from Japanese Patent Application No. 2018-136485 filed on Jul. 20, 2018. The contents of these applications are incorporated herein by reference in their entireties.

BACKGROUND OF THE DISCLOSURE

Field of the Disclosure

The present disclosure relates to a module where electronic components are mounted.

Description of the Related Art

A module has been disclosed to date, which includes a heat-producing component mounted on a substrate and is covered with an electromagnetic shielding material, where a conductor film provided on the substrate is in contact with the heat-producing component and is in contact with the electromagnetic shielding material at any one of the side surfaces of the substrate (in, for example, Patent Document 1).

In this, the heat caused in the heat-producing component is transferred to the electromagnetic shielding material through the conductor film and thus heat dissipation is enabled.

Patent Document 1: International Publication No. WO 2016/08033.

BRIEF SUMMARY OF THE DISCLOSURE

In the configuration disclosed in Patent Document 1 described above, however, the heat dissipation is caused only from any one of the side surfaces of the substrate and there has been a possibility of failing to ensure favorable heat dissipation properties of the module.

Thus, an object of the present disclosure is to provide a module that can enhance the heat dissipation properties.

To achieve the above-described object, a module according to an aspect of the present disclosure includes: a substrate that has a polygonal shape in a plan view; a first electronic component and a second electronic component that are mounted on one main surface of the substrate; and side electrodes provided on at least two side surfaces of a plurality of side surfaces that form the polygonal shape of the substrate, and in the module, a first conductor film coupled to the first electronic component and a second conductor film coupled to the second electronic component are provided on the substrate, the first conductor film extends to reach a first side surface of the at least two side surfaces to be coupled to the side electrode provided on the first side surface, and the second conductor film extends to reach a second side surface of the at least two side surfaces to be coupled to the side electrode provided on the second side surface, the second side surface being different from the first side surface.

To achieve the above-described object, a module according to an aspect of the present disclosure includes: a substrate that has a polygonal shape in a plan view; a first electronic component mounted on one main surface of the substrate; and side electrodes provided on at least two side surfaces of a plurality of side surfaces that form the polygonal shape of the substrate, and in the module, a first conductor film and a fifth conductor film that are each coupled to the first electronic component are provided on the substrate, the first conductor film extends to reach a first side surface of the at least two side surfaces to be coupled to the side electrode provided on the first side surface, and the fifth conductor film extends to reach a third side surface of the at least two side surfaces to be coupled to the side electrode provided on the third side surface, the third side surface being different from the first side surface.

The present disclosure enables it to attain a module that can enhance the heat dissipation properties.

DETAILED DESCRIPTION OF THE DISCLOSURE

Embodiments of the present disclosure are described in detail below with reference to the drawings. All the embodiments described below present comprehensive or specific examples. The values, shapes, materials, constituent elements, arrangements and coupling forms of the constituent elements, and the like mentioned in the embodiments below are examples and are not intended to limit the present disclosure. Among the constituent elements in the embodiments below, the constituent elements that are not recited in the independent claims are described as being arbitrary constituent elements. The sizes or size ratios of the constituent elements illustrated in the drawings are not necessarily precise. In each drawing, elements with substantially identical configurations are given identical reference signs and overlapping descriptions thereof may be omitted or simplified. Further, in the embodiments below, "coupling" not only includes direct coupling but also includes electrical coupling with another element or the like interposed therebetween. Moreover, the "coupling" may include being in physical contact.

First Embodiment

A module according to a first embodiment is described below with reference to FIGS. 1 to 5.

First, a configuration of the module according to the first embodiment is described.

Figure 1:
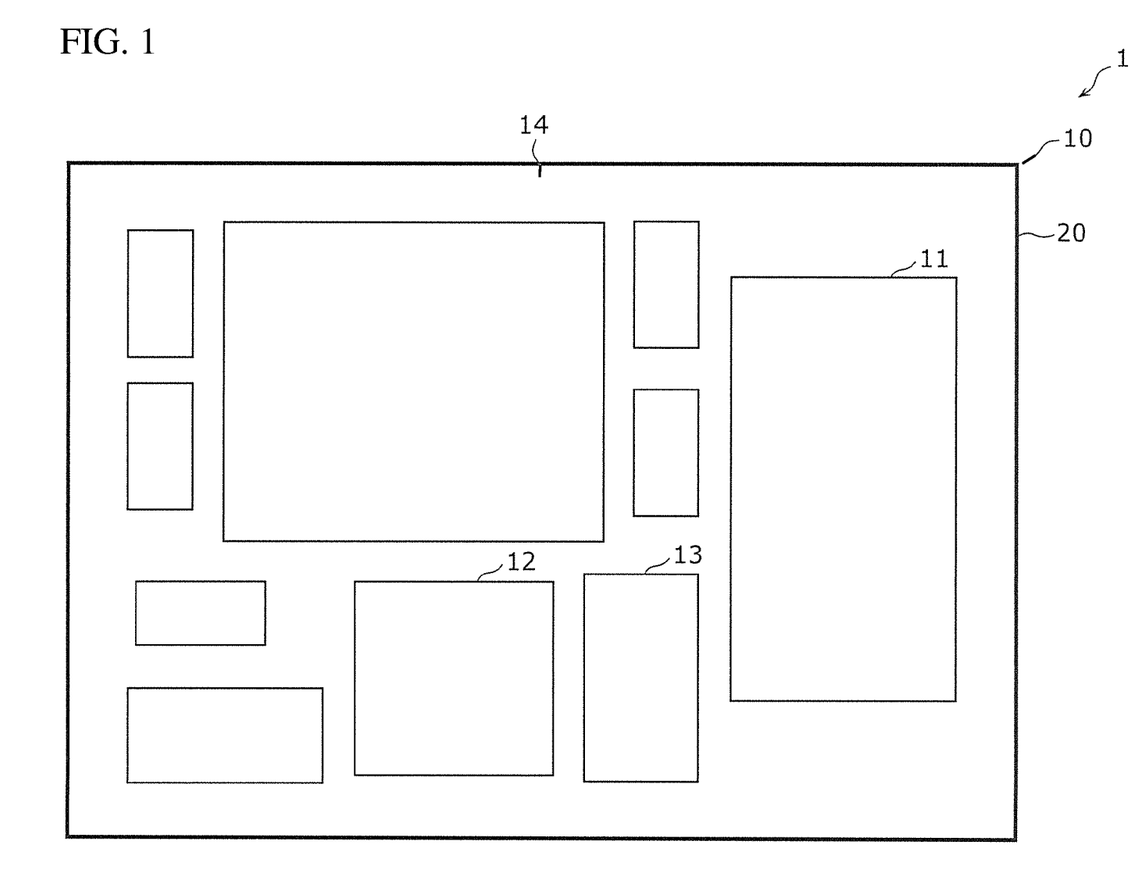
FIG. 1 is a plan perspective view of a module according to a first embodiment.
Figure 2:
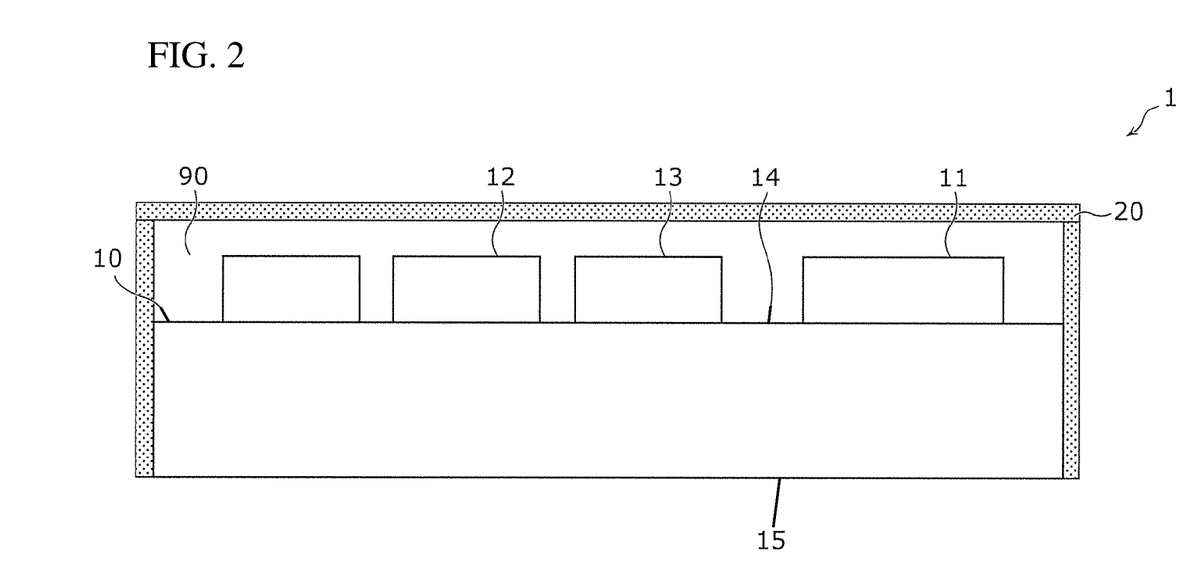
FIG. 2 is a side perspective view of the module according to the first embodiment.

FIG. 1 is a plan perspective view of the module 1 according to the first embodiment. FIG. 2 is a side perspective view of the module according to the first embodiment.

As illustrated in FIGS. 1 and 2, the module 1 includes a substrate 10, a plurality of electronic components mounted on one main surface 14 (the upper surface) of the substrate 10, and a shield 20 provided so as to cover the plurality of electronic components mounted on the one main surface 14 of the substrate 10 above the side surfaces of the substrate 10 and the one main surface 14 of the substrate 10 (on the upper side in the diagram of FIG. 2). A plurality of electronic components may also be mounted on the other main surface 15 (the lower surface) of the substrate 10 and the shield 20 may cover the plurality of electronic components mounted on the other main surface 15 of the substrate 10 below the substrate 10. FIG. 1 is a diagram viewing the module from the side of the top surface of the shield 20 which is made transparent. FIG. 2 is a diagram viewing the module from the side of one of the side surfaces of the shield 20 which is made transparent.

The substrate 10 is the substrate with the one main surface 14 on which the plurality of electronic components are mounted. In FIGS. 1 and 2, the plurality of electronic components are schematically illustrated as rectangles. Specifically, in FIG. 1, ten electronic components on the substrate 10 are illustrated. Further, in FIG. 2, the illustration of part of the plurality of electronic components in FIG. 1 is omitted and four electronic components on the substrate 10 are illustrated. In the present embodiment, electronic components 11 to 13 that are included in the plurality of electronic components and given the reference signs in FIGS. 1 and 2 are described as focuses of attention. As described above, the electronic components 11 to 13 are mounted on the one main surface 14 of the substrate 10, and the electronic components 11, 12, and 13 serve as a first electronic component, a second electronic component, and a third electronic component, respectively.

Figure 4:
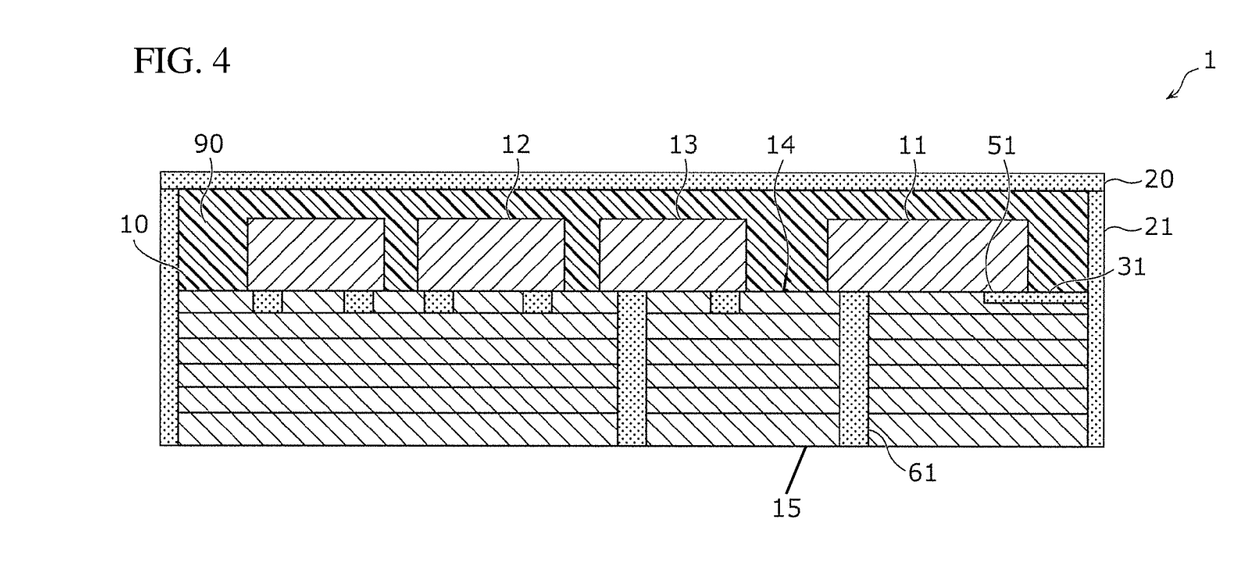
FIG. 4 is a cross-sectional view of the module according to the first embodiment.

In a plan view of the substrate 10, that is, when viewed from the upper side of the substrate 10 (the side of the one main surface 14), the substrate 10 has a polygonal shape. In the present embodiment, the substrate 10 has a rectangular shape. The substrate 10 may have a triangular shape or a shape of a pentagon or more. Moreover, the substrate 10 is, for example, a laminated substrate including a plurality of layers. FIG. 4, described later, illustrates that the plurality of layers are laminated to form the substrate 10 and shows that the substrate 10 is a multilayer substrate.

The substrate 10 may be, for example, a low temperature co-fired ceramic (LTCC) substrate or be a printed board or the like. As discussed with reference to FIGS. 3 and 4, described later, the substrate 10 is provided with conductor wiring patterns or conductor films on the one main surface 14 and an inner layer so as to extend in a direction approximately parallel to the one main surface 14 and with via conductors provided in a direction that crosses the one main surface 14, specifically in an approximately vertical direction. As the various conductors of the substrate 10, for example, Al, Cu, Au, Ag, or metal that mainly contain an alloy of these is used.

Examples of the plurality of electronic components include an amplification component such as a power amplifier (PA) or a low noise amplifier (LNA), a regulator such as a low dropout (LDO) or a DC-DC converter, a filter component or an intelligent power device (IPD) such as an acoustic wave filter or an LC filter, and a passive component such as a chip capacitor, a chip inductor, or a chip resistor.

The electronic component 11 is a first electronic component mounted on the one main surface 14 of the substrate 10 and is, for example, at least one of an amplification component and a regulator. The electronic component 12 is a second electronic component mounted on the one main surface 14 of the substrate 10 and is, for example, at least one of an amplification component and a regulator. The electronic component 13 is a third electronic component mounted on the one main surface 14 of the substrate 10 between the electronic component 11 and the electronic component 12 in a plan view of the substrate 10 and is, for example, a passive component. An amplification component or a regulator produces heat by itself and the electronic components 11 and 12 are each a heat-producing component accordingly, while a passive component produces no heat by itself and the electronic component 13 is a non-heat-producing component accordingly.

For example, resin 90 with which the plurality of electronic components on the one main surface 14 of the substrate 10 are sealed is provided. The resin 90 is not illustrated in FIG. 1 and is made transparent in FIG. 2. As the resin 90, for example, a typical material for the sealing of electronic components and so on, such as epoxy resin or the like, can be used.

The shield 20 is an electromagnetic shield formed so as to cover the side surfaces of the substrate 10 and a surface of the resin 90. The shield 20 is formed by, for example, sputtering or the like. The bold solid line drawn for the periphery of the substrate 10 in FIG. 1 indicates the shield 20 formed over the substrate 10 and the side surfaces of the resin 90. The shield 20 interrupts unwanted electromagnetic waves for the plurality of electronic components mounted on the substrate 10 and unwanted emissions caused from the plurality of electronic components, and the like. Further, the shield 20 has a function of dissipating the heat caused by heat-producing components, such as the electronic components 11 and 12. The function is described later.

The shield 20 is provided so as to cover the one main surface 14 of the substrate 10 above all of the side surfaces of the substrate 10 and the substrate 10 so as to function as an electromagnetic shield, but if used as a heat dissipation member, the shield 20 need not necessarily be provided so as to cover the one main surface 14 of the substrate 10. Specifically, the shield 20 need not necessarily be provided above the substrate 10 or need not necessarily be provided over all of the side surfaces of the substrate 10. For example, it is just needed for the shield 20 to be provided over at least two side surfaces of the plurality of side surfaces that form the polygonal shape (here, the rectangular shape) of the substrate. The shield 20 provided on the at least two side surfaces may also be referred to as side electrodes. Moreover, the side electrode need not necessarily be provided on the entire side surface where the side electrode is provided and may be provided on part of the side surface.

Next, the various conductors provided on the substrate 10 and the like are described with reference to FIGS. 3 to 5.

Figure 3:
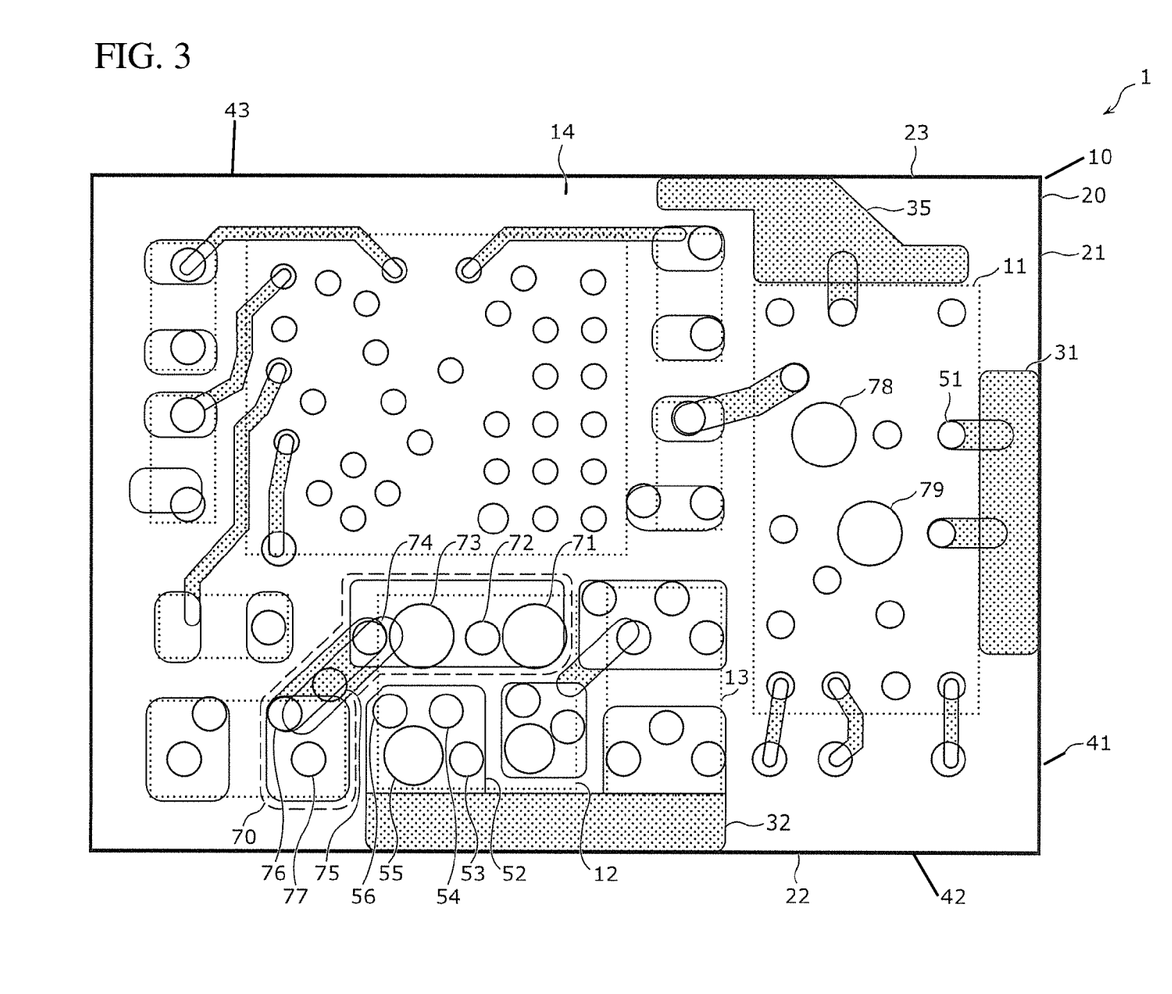
FIG. 3 is a plan perspective view of a configuration on one main surface of a substrate according to the first embodiment.

FIG. 3 is a plan perspective view of a configuration on the one main surface 14 of the substrate 10 according to the first embodiment. In FIG. 3, the top surface of the shield 20 is made transparent while the plurality of electronic components are made transparent and only their outer edges are indicated with the dotted lines.

Conductor films and conductor wiring patterns are provided on the one main surface 14 of the substrate 10. In FIG. 3, the dot hatching is given to portions in which no conductor film or conductor wiring pattern is exposed and that are each covered with a resist or the like for example. In FIG. 3, portions indicated with many circles depict mounting lands for mounting the electronic components on the substrate 10, and ends of the via conductors that extend from the inside of the substrate 10 and reach the one main surface 14.

The mounting lands are, for example, portions on the conductor films and the conductor wiring patterns from which resists or the like are removed, and the ends of the via conductors may be used as the mounting lands. In addition, like the portion to which "reference sign 52" is given, portions that overlap the electronic components and are approximately rectangular in a plan view of the substrate 10 are also the mounting lands on the conductor films and the conductor wiring patterns from which resists or the like are removed.

In the present embodiment, side electrodes are provided on at least two (here, four) side surfaces of the four side surfaces that form the rectangular shape of the substrate 10 as part of the shield 20. In a plan view of the substrate 10 in FIG. 3, a side surface 41 on the right side in the diagram is a first side surface, a side surface 42 on the lower side in the diagram is a second side surface, and a side surface 43 on the upper side in the diagram is a third side surface. In the present embodiment, the three side surfaces are described as focuses of attention. A side electrode 21 is provided on the side surface 41, a side electrode 22 is provided on the side surface 42, and a side electrode 23 is provided on the side surface 43.

Conductor films 31, 32, and 35 are provided on the substrate 10. Specifically, the conductor films 31, 32, and 35 are provided on the one main surface 14 of the substrate 10. Aside from the conductor films 31, 32, and 35, another conductor film may be provided on the one main surface 14 of the substrate 10. In the present embodiment, the conductor films 31, 32, and 35 are described as focuses of attention.

The conductor film 31 is a first conductor film coupled to the electronic component 11. The conductor film 32 is a second conductor film coupled to the electronic component 12. The conductor film 35 is a fifth conductor film coupled to the electronic component 11. In the present embodiment, while the conductor films 31, 32, and 35 are coupled to the corresponding electronic components electrically with the mounting lands interposed therebetween, the conductor films can also be in physical contact with the corresponding electronic components in addition. For example, if the resin 90 enters between the housing of the electronic components or the like and the conductor films, the electronic component and the conductor film can come into contact with the resin 90 or the like interposed therebetween.

The conductor film 31 extends to reach the side surface 41 of the four side surfaces to be coupled to the side electrode 21 provided on the side surface 41. Specifically, as illustrated in FIG. 3, the conductor film 31 extends on the one main surface 14 to reach the side surface 41. The conductor film 32 extends to reach the side surface 42 of the four side surfaces, which is different from the side surface 41, to be coupled to the side electrode 22 provided on the side surface 42. Specifically, as illustrated in FIG. 3, the conductor film 32 extends on the one main surface 14 to reach the side surface 42. The conductor film 35 extends to reach the side surface 43 of the four side surfaces, which is different from the side surface 41, to be coupled to the side electrode 23 provided on the side surface 43. Specifically, as illustrated in FIG. 3, the conductor film 35 extends on the one main surface 14 to reach the side surface 43. The conductor film 35 may be provided on the side of the side surface 42 of the electronic component 11 and extend to reach the side surface 42.

That a conductor film extends to reach a side surface not only includes a case where a conductor film reaches a side surface on the one main surface 14 but also includes a case where conductor films provided on a plurality of layers while being mutually coupled by a via conductor or the like extend on, for example, the inner layers to reach a side surface.

The heat caused by the electronic component 11 is dissipated from the side electrode 21 provided on the side surface 41 through the conductor film 31 coupled to the electronic component 11, and the heat caused by the electronic component 12 is dissipated from the side electrode 22 provided on the side surface 42 through the conductor film 32 coupled to the electronic component 12. Thus, by making the heat dissipation paths of the heat caused in the electronic component 11 and the electronic component 12 different into the path to the side surface 41 and the path to the side surface 42, the heat can be dispersed in a plurality of positions and dissipated and accordingly, the heat dissipation properties can be further enhanced in comparison with a case where the heat is dissipated collectively in one position.

Further, although the side electrode 21 and the side electrode 22 are formed so as to be integral as the shield 20 in the present embodiment, for example, it is also conceivable to provide side electrodes for heat dissipation separately. However, if for example, the conductor film 31 coupled to the electronic component 11 and the conductor film 32 coupled to the electronic component 12 reach respective single side surfaces, each of the side electrodes for the heat dissipation of the electronic components 11 and 12 needs to be formed on the single side surface and thus, it is not easy for each side electrode to be formed so as to be large, and the heat dissipation properties can be lowered. In contrast, as in the present embodiment, when the conductor film 31 and the conductor film 32 reach the side surfaces 41 and 42 different from each other, respectively, regions for the side surfaces 41 and 42 can each be used largely in forming the side electrodes 21 and 22 for the heat dissipation of the electronic components 11 and 12. Accordingly, the side electrodes 21 and 22 can be formed so as to be large, that is, the thermal resistance can be lowered and the heat dissipation properties can be enhanced.

Further, one part of the heat caused by the electronic component 11 is dissipated from the side electrode 21 provided on the side surface 41 through the conductor film 31 coupled to the electronic component 11, and another part is dissipated from the side electrode 23 provided on the side surface 43 through the conductor film 35 coupled to the electronic component 11. As described above, by dividing the heat dissipation path of the heat caused in the electronic component 11 into a plurality of paths, such as the path to the side surface 41 and the path to the side surface 43, the heat can be dispersed in a plurality of positions and dissipated and thus, the heat dissipation properties can be further enhanced in comparison with a case where the heat is dissipated collectively in one position.

In addition, the conductor films 31 and 32 each extend on the one main surface 14 to reach the respective side surfaces, and the heat caused in the electronic components 11 and 12 is transferred over the one main surface 14 of the substrate 10 and thus, the persistence of the heat inside the substrate 10 can be inhibited and the heat dissipation properties can be enhanced.

If the electronic components 11 and 12 are provided close to each other, the concentrated production of the heat occurs in one portion and as a result, the heat production of the module 1 can be promoted. Besides, one of the electronic components 11 and 12 can apply the heat to the other and cause the decrease in performance or malfunction of the other. In contrast, when the electronic component 13 is provided between the electronic component 11 and the electronic component 12, the electronic component 11 and the electronic component 12 can be positioned away from each other by at least a distance corresponding to the side of the electronic component 13. That is, for example, by obviating the concentration of the locations of the electronic component 11 and the electronic component 12 as the sources of the heat production, the heat dissipation properties can be enhanced and the decrease in performance or malfunction of the electronic components 11 and 12 can be inhibited.

As illustrated in FIG. 3, the electronic component 13 is coupled to at least one (here, the conductor film 32) of the conductor film 31 and the conductor film 32. In the present embodiment, while the conductor film 32 is coupled to the electronic component 13 electrically with the mounting land interposed therebetween, the conductor film can also be in physical contact with the corresponding electronic component in addition. For example, if the resin 90 enters between the housing of the electronic components or the like and the conductor films, the housing of the electronic component 13 and the conductor film 32 may come into contact with the sealing resin or the like interposed therebetween.

Thus, when the electronic component 13 is used also as a heat dissipation component, the heat caused in the electronic component 12 can be transferred to the electronic component 13 too, that is, the escape destinations of the heat can be increased and the heat dissipation properties can be enhanced. When, in particular, the electronic component 13 is a passive component, it is not easy for the electronic component 13 itself to produce heat and thus, the heat dissipation properties can be further enhanced. If the electronic component 13 is coupled to the conductor film 31, the heat caused in the electronic component 11 can be transferred to the electronic component 13.

At least one mounting land where at least one electronic component of the electronic component 11 and the electronic component 12 is mounted is provided on the one main surface 14 of the substrate 10. For example, the at least one electronic component denotes the electronic component 11, and the at least one mounting land denotes many circular portions in FIG. 3 that overlap the electronic component 11 in a plan view of the substrate 10. One of the many circles is given "reference sign 51". The at least one mounting land includes the mounting land 51 that does not overlap a via conductor whose one end reaches the other main surface 15 of the substrate 10 in a plan view of the substrate 10. For example, the substrate 10 is mounted over a motherboard or the like on the side of the other main surface 15 and in the state where the substrate 10 is not mounted over a motherboard or the like, such a via conductor whose one end reaches the other main surface 15 of the substrate 10 is exposed from the other main surface 15. Now, the mounting land 51 is described with reference to FIG. 4.

FIG. 4 is a cross-sectional view of the module 1 according to the first embodiment. FIG. 4 is a cross-sectional view of the module 1 that passes through the mounting land 51 and is taken in a direction parallel to the side surfaces 42 and 43 while illustrating constituent elements in another cross section in the identical drawing. Specifically, the electronic components 12 and 13 are in a cross section different from the cross section that passes through the mounting land 51 but are illustrated in the identical drawing. Further, as for the configuration inside the substrate 10, most parts are omitted and only some of the via conductors are illustrated.

Examples of the via conductor whose one end reaches the other main surface 15 of the substrate 10 include a via conductor 61 illustrated in FIG. 4. The via conductor 61 is electrically coupled to the electronic component 11 and is used so as to couple the conductor films or the conductor wiring patterns and the like between the layers of the substrate 10 and dissipate the heat caused by the electronic component 11. For example, when the via conductor 61 is used for heat dissipation, the via conductor 61 reaches the other main surface 15 of the substrate 10 and can thus be brought into contact or coupled to a heat dissipation member (e.g. a large ground electrode or the like) that is low in thermal resistance and favorable in heat dissipation on the other main surface 15. Accordingly, the via conductor 61 enables the heat caused by the electronic component 11 to be dissipated.

In contrast, the mounting land 51 is not overlapped by a via conductor like the via conductor 61 in a plan view of the substrate 10. It is because, for example, the mounting land 51 is a mounting land present near the periphery of the substrate 10 and it is necessary to give a certain distance between the periphery and a via conductor in view of substrate design and thus it is difficult to provide a via conductor immediately under the mounting land 51 positioned near the periphery.

Therefore, the mounting land 51 is coupled to the conductor film 31 or the conductor film 32 (here, the conductor film 31) coupled to the at least one of the electronic components (here, the electronic component 11) on the one main surface 14. While the mounting land 51 is a portion where a resist or the like on the conductor film 31 is removed and that is part of the conductor film 31, that the mounting land 51 is coupled to the conductor film 31 also includes a case where the mounting land 51 is part of the conductor film 31 as mentioned above.

Even when a via conductor like the via conductor 61 is not coupled to the mounting land 51 or the mounting land 51 does not constitute an end of a via conductor like the via conductor 61, the conductor film 31 is coupled to the side electrode 21 and thus, the heat caused by the electronic component 11 mounted on the mounting land 51 can be transferred to the mounting land 51, the conductor film 31, and the side electrode 21, and dissipated.

Instead of a via conductor constituted by a single via conductor like the via conductor 61 that runs through the substrate 10, a plurality of via conductors can be used, which are provided for each layer of the substrate 10 and are mutually coupled by a pattern conductor or the like provided on each layer while forming a shape winding from the side of the one main surface 14 to the side of the other main surface 15, including the pattern conductors. In this case, one end of the plurality of via conductors as a whole can reach the other main surface 15 of the substrate 10, and the other end can be coupled to the mounting land 51. In such a case, the via conductor included in the plurality of via conductors and positioned at the other end (the via conductor included in the plurality of via conductors and arranged closest to the mounting land 51) overlaps the mounting land 51 in a plan view of the substrate 10 but does not reach the other main surface 15 as the via conductor at the other end as a unit. Therefore, it can be said that even when one end of the plurality of via conductors reaches the other main surface 15 of the substrate 10 and the other end is coupled to the mounting land 51, the mounting land 51 does not overlap the via conductor whose one end reaches the other main surface 15 of the substrate 10 in a plan view of the substrate 10. In other words, such via conductors may be coupled to the mounting land 51.

At least one mounting land where at least one electronic component of the electronic component 11 and the electronic component 12 is mounted is provided on the one main surface 14 of the substrate 10. For example, the at least one of electronic component denotes the electronic component 12, and the at least one mounting land denotes three rectangular portions in FIG. 3 that overlap the electronic component 12 in a plan view of the substrate 10. One of the three rectangular portions is given "reference sign 52". The at least one mounting land includes the mounting land 52 coupled to the first via conductor whose one end reaches the other main surface 15 of the substrate 10. The first via conductor denotes, for example, the via conductors 53 to 56. The mounting land 52 is coupled to the plurality of first via conductors but need just be coupled to at least one of the first via conductors.

Like the via conductor 61 illustrated in FIG. 4, the via conductors 53 to 56 are via conductors whose one ends reach the other main surface 15 of the substrate 10. The via conductors 53 to 56 are used so as to couple the mounting land 52 to the conductor films or the conductor wiring patterns and the like on the inner layers of the substrate 10 and dissipate the heat caused by the electronic component 12. While the mounting land 52 is a portion where a resist or the like on the conductor film 32 is removed and that is part of the conductor film 32, that the mounting land 52 and the via conductors 53 to 56 are coupled means that the conductor film 32 and the via conductors 53 to 56 are arranged flush with each other and coupled in a direction parallel to the one main surface 14 or that the conductor film 32 and the via conductors 53 to 56 overlap in a plan view of the substrate 10 and are coupled in a direction parallel to the one main surface 14.

Further, the mounting land 52 is coupled to the conductor film 31 or the conductor film 32 (here, the conductor film 32) coupled to the at least one of the electronic components (here, the electronic component 12) on the one main surface 14. While the mounting land 52 is a portion where a resist or the like on the conductor film 32 is removed and that is part of the conductor film 32, that the mounting land 52 is coupled to the conductor film 32 also includes a case where the mounting land 52 is part of the conductor film 32 as mentioned above.

The via conductors 53 to 56 reach the other main surface 15 of the substrate 10 and can thus be brought into contact or coupled to a heat dissipation member that is low in thermal resistance on the other main surface 15 and favorable in heat dissipation. Accordingly, the via conductors 53 to 56 enable the heat caused by the electronic component 12 to be dissipated. Further, the conductor film 32 is coupled to the side electrode 22 and thus, the heat caused by the electronic component 12 mounted on the mounting land 52 can be transferred to the mounting land 52, the conductor film 32, and the side electrode 22 and dissipated. Accordingly, the path through the via conductors 53 to 56 and the path through the conductor film 32 enable the heat caused by the electronic component 12 to be dissipated efficiently. Only any one of the via conductors 53 to 56 enables the heat dissipation effect to be exerted sufficiently.

A power supply line that is coupled to at least one electronic component of the electronic component 11 and the electronic component 12 is provided on the substrate 10. For example, the at least one electronic component is the electronic component 12, and the power supply line coupled to the electronic component 12 is a power supply line 70 surrounded by the broken line in FIG. 3.

The power supply line 70 is a portion that allows relatively large current to flow therethrough more easily, that is, that generates heat in the substrate 10 more easily than a signal line or the like.

Thus, the power supply line 70 is coupled to a plurality of second via conductors whose one ends reach the other main surface 15 of the substrate 10. The plurality of second via conductors are, for example, a plurality of via conductors 71 to 77. Like the via conductor 61 illustrated in FIG. 4, the plurality of via conductors 71 to 77 are via conductors whose one ends reach the other main surface 15 of the substrate 10.

The plurality of via conductors 71 to 77 reach the other main surface 15 of the substrate 10 and can thus be brought into contact or coupled to a heat dissipation member that is low in thermal resistance and favorable in heat dissipation on the other main surface 15. Accordingly, the plurality of via conductors 71 to 77 enable the heat caused in the power supply line 70 to be dissipated.

Although not illustrated in FIG. 3, a power supply line may be coupled to the electronic component 11 and the power supply line may be coupled to the plurality of second via conductors whose one ends reach the other main surface 15 of the substrate 10.

A plurality of via conductors including a fourth via conductor whose one end reaches the other main surface 15 of the substrate 10 is provided on the substrate 10. The plurality of via conductors include a via conductor for coupling to a conductor film or a conductor wiring pattern on an inner layer of the substrate 10 and a via conductor that enables the heat caused by an electronic component to be dissipated efficiently. The fourth via conductor is a via conductor like the via conductor 61 illustrated in FIG. 4 and is a via conductor that can dissipate the heat caused by an electronic component efficiently.

The fourth via conductor as described above is a via conductor whose diameter is larger than the diameter of another via conductor in the plurality of via conductors. The fourth via conductor denotes, for example, via conductors 55, 71, 73, 78, 79, and the like illustrated in FIG. 3. The via conductor 55 also serves as the first via conductor. Further, the via conductors 71 and 73 also serve as the second via conductors. Thus, at least two via conductors of the first via conductor, the second via conductor, the third via conductor, and the fourth via conductor may be identical via conductors. As illustrated in FIG. 3, it can be seen that the via conductors 55, 71, 73, 78, and 79 are larger in diameter than another via conductor (e.g. the via conductor having a diameter identical to the diameter of the mounting land 51 in FIG. 3).

A via conductor with a large diameter is low in thermal resistance and thus enables the heat dissipation properties to be further enhanced when coupled to what can be the source of the heat production, such as the mounting land 52 of the electronic component 12 or the power supply line 70.

The heat dissipation properties can be further enhanced by providing a plurality of via conductors small in diameter in a region instead of a via conductor large in diameter so as to be approximately identical in volume to the via conductor large in diameter. This is because although the volume of the plurality of via conductors small in diameter and the volume of the via conductor large in diameter are approximately identical, the total surface area of the plurality of via conductors small in diameter is larger.

Further, the heat caused by the electronic components 11 and 12 is transferred into the substrate 10 and the heat can persist in the substrate 10. In contrast, the substrate 10 has a configuration where persistence of heat is inhibited. This is described with reference to FIG. 5.

Figure 5:
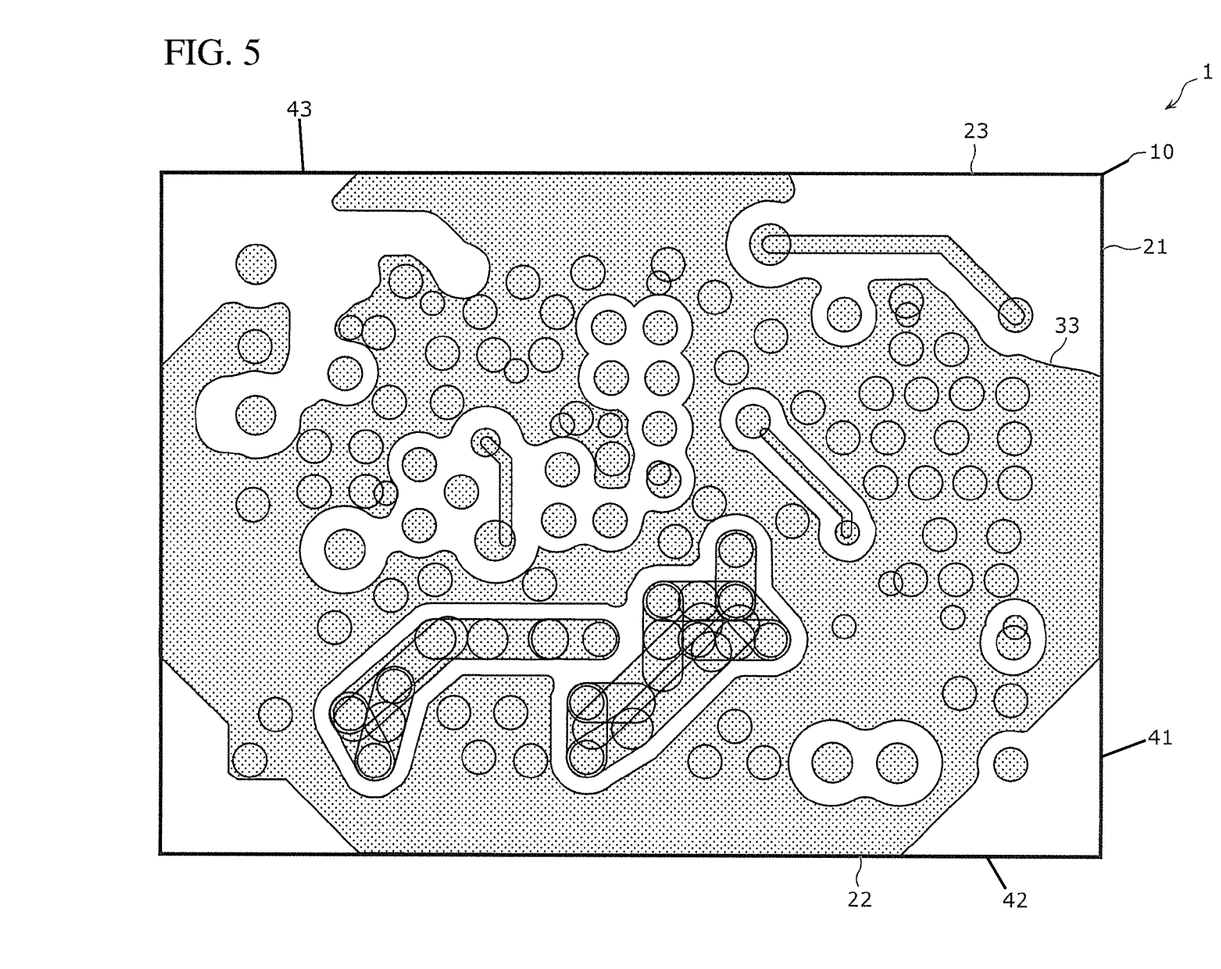
FIG. 5 is a plan view illustrating a configuration of an inner layer of the substrate according to the first embodiment.

FIG. 5 is a plan view illustrating a configuration of an inner layer of the substrate 10 according to the first embodiment.

A conductor film 33 is provided on at least one inner layer in the substrate 10 among a plurality of layers included in the substrate 10 as a laminated substrate. FIG. 5 illustrates an inner layer where the conductor film 33 is provided. The conductor film 33 is a third conductor film that extends to reach two or more (here, four) side surfaces of the four side surfaces and is coupled to the side electrodes provided on the four side surfaces.

Since the conductor film 33 provided in the substrate 10 is coupled to two or more side electrodes provided on the four side surfaces, that is, coupled to the side electrodes, the number of which is larger than the number of side electrodes to which the conductor films 31, 32, and 35 provided on the one main surface 14 are coupled, the heat caused by the electronic components 11 and 12 and transferred into the substrate 10 can be transferred to the conductor film 33 and the side electrodes and dissipated.

Further, at least one of the conductor films 31 and 32 and the conductor film 33 may be provided so as to reach an identical side surface, and it is desirable that at least respective parts of the conductor films 31 and 33 or at least respective parts of the conductor films 32 and 33 overlap in a plan view of the substrate 10. In the present embodiment, in a plan view of the substrate 10, the conductor films 31 and 32 each overlap the conductor film 33 almost completely. Typically, the shield 20 (the side electrodes 21 and 22) is set at a ground potential in many cases, and the conductor films 31, 32, and 33 coupled to the side electrodes 21 and 22 are also at a ground potential. In terms of a distributed constant circuit, when the conductor films 31 and 33 and the conductor films 32 and 33, which are both at a ground potential, overlap in a plan view of the substrate 10, the conductor films 31 and 33 and the conductor films 32 and 33 can be arranged close to each other and the ground potential can be made stable.

Second Embodiment

Subsequently, a module according to a second embodiment is described with reference to FIGS. 6 and 7.

Figure 6:
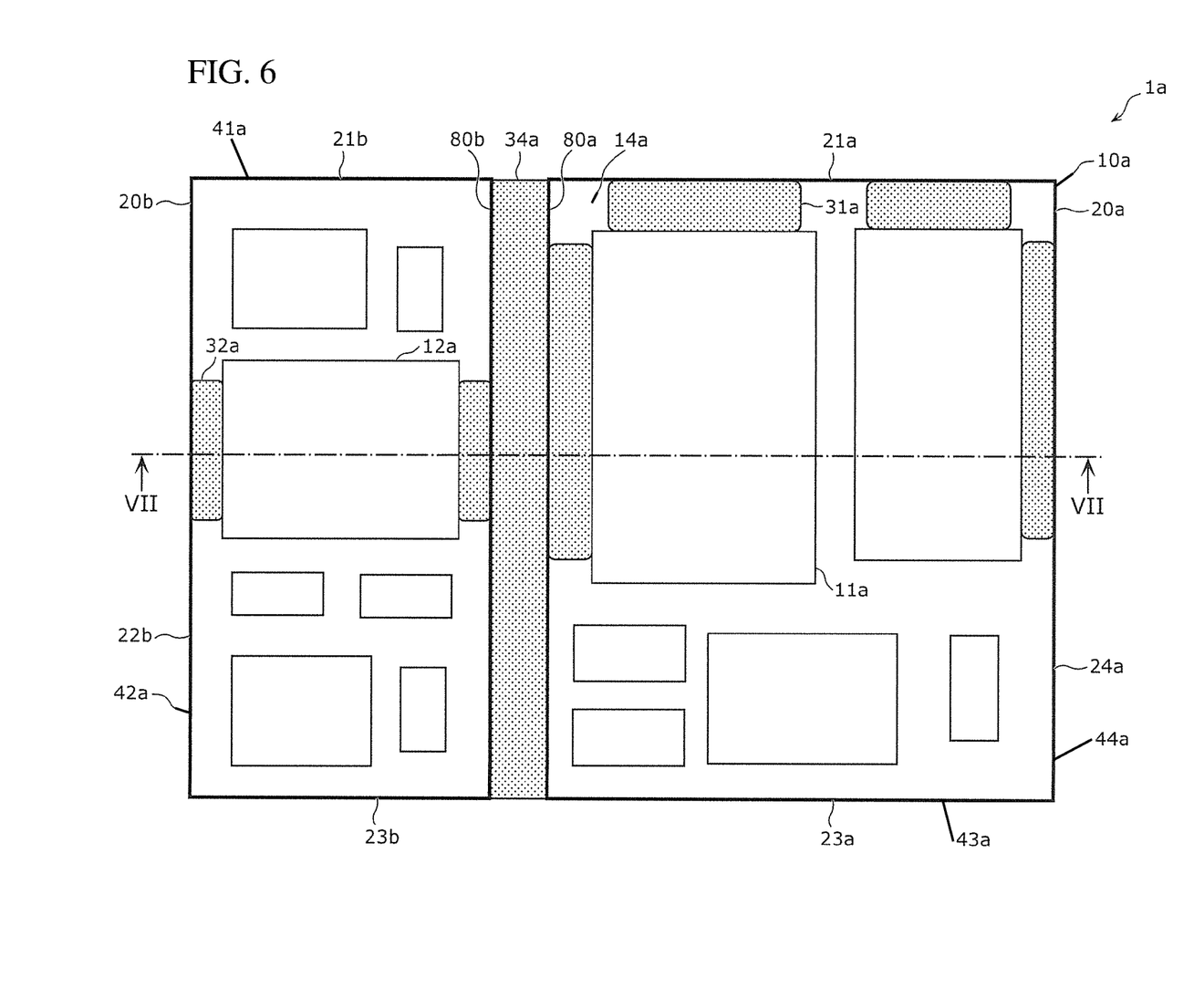
FIG. 6 is a plan perspective view of a module according to a second embodiment.

FIG. 6 is a plan perspective view of the module 1a according to the second embodiment. FIG. 7 is a cross-sectional view of the module 1a according to the second embodiment. Specifically, FIG. 7 illustrates a cross section taken along line VII-VII drawn in FIG. 6. Further, in FIG. 7, as for the configuration inside the substrate, most parts are omitted and only some of the via conductors are illustrated. The second embodiment is different from the first embodiment in that the shield provided over the substrate is divided into two.

Figure 7:
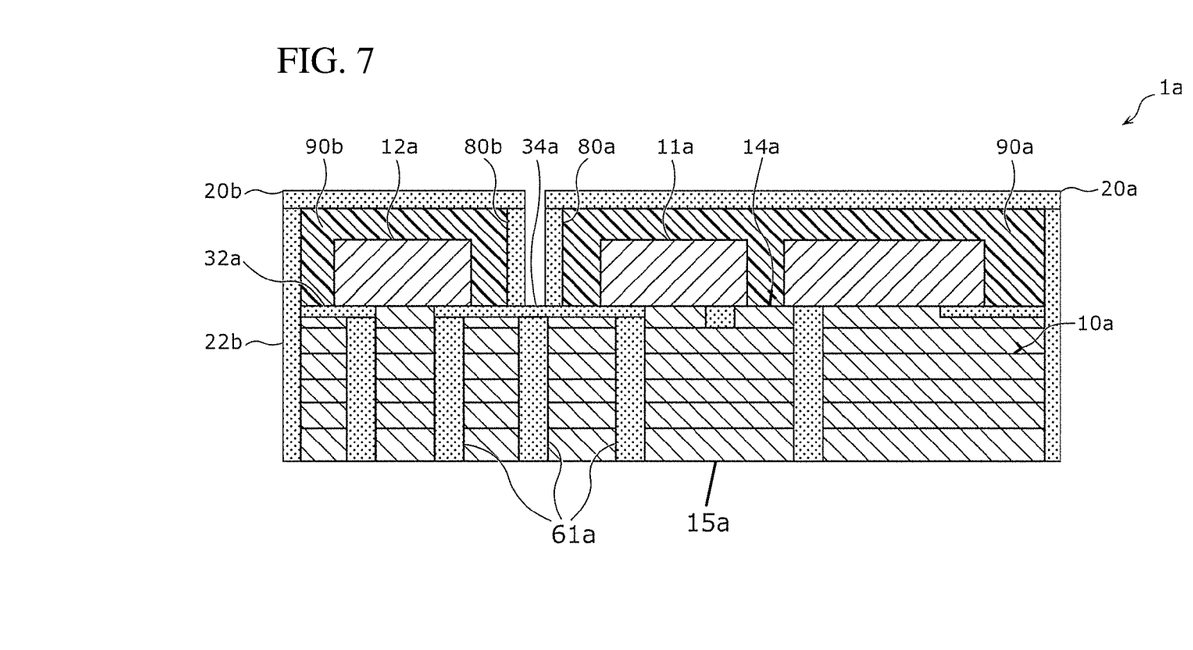
FIG. 7 is a cross-sectional view of the module according to the second embodiment.

As illustrated in FIGS. 6 and 7, the module 1a includes a substrate 10a, a plurality of electronic components mounted on one main surface 14a (the upper surface) of the substrate 10a, and shields 20a and 20b provided so as to cover the plurality of electronic components mounted on the one main surface 14a of the substrate 10a above the side surfaces of the substrate 10a and the one main surface 14a of the substrate 10a (on the upper side in the diagram of FIG. 7). A plurality of electronic components may also be mounted on the other main surface 15a (the lower surface) of the substrate 10a, and the shields may cover the plurality of electronic components mounted on the other main surface 15a of the substrate 10a below the other main surface 15a of the substrate 10a (on the lower side in the diagram of FIG. 7). FIG. 6 is a plan view of the module 1a when the top surfaces of the shields 20a and 20b are made transparent. The bold solid lines drawn in FIG. 6 indicate the side surfaces of the shields 20a and 20b in a plan view of the substrate 10a.

The substrate 10a is the substrate with the one main surface 14a on which the plurality of electronic components are mounted. In FIGS. 6 and 7, the plurality of electronic components are schematically illustrated as rectangles. Specifically, in FIG. 6, 13 electronic components on the substrate 10a are illustrated. In the present embodiment, electronic components included in the plurality of electronic components and given reference signs in FIGS. 6 and 7, 11a and 12a, are described as focuses of attention. While the electronic components 11a and 12a are each mounted on the one main surface 14a of the substrate 10a, the electronic component 11a is a first electronic component and the electronic component 12a is a second electronic component.

In a plan view of the substrate 10a, that is, when viewed from the upper side of the substrate 10a (the side of the one main surface 14a), the substrate 10a has a polygonal shape. In the present embodiment, the substrate 10a has a rectangular shape. The substrate 10a may have a triangular shape or a shape of a pentagon or more. Moreover, the substrate 10a is, for example, a laminated substrate including a plurality of layers. FIG. 7 illustrates that the plurality of layers are laminated to form the substrate 10a and shows that the substrate 10a is a multilayer substrate.

The substrate 10a may be, for example, an LTCC substrate or be a printed board or the like. Further, the substrate 10a is provided with conductor wiring patterns or conductor films on the one main surface 14a so as to extend in a direction approximately parallel to the one main surface 14a and with via conductors provided in a direction that crosses the one main surface 14a, specifically in an approximately vertical direction. As the various conductors of the substrate 10a, for example, Al, Cu, Au, Ag, or metal that mainly contain an alloy of these is used.

The electronic component 11a is a first electronic component mounted on the one main surface 14a of the substrate 10a and is, for example, at least one of an amplification component and a regulator. The electronic component 12a is a second electronic component mounted on the one main surface 14a of the substrate 10a and is, for example, at least one of an amplification component and a regulator. In the present embodiment, the electronic components 11 and 12 are each a heat-producing component.

Although the illustration is omitted in FIG. 6, for example, resin 90a and resin 90b for the sealing of the plurality of electronic components are provided on the one main surface 14a of the substrate 10a. The resin 90a is provided so as to fill the gap between the shield 20a and the substrate 10a as illustrated in FIG. 7 and used for the sealing of six electronic components including the electronic component 11a as illustrated in FIG. 6. The resin 90b is provided so as to fill the gap between the shield 20b and the substrate 10a as illustrated in FIG. 7 and used for the sealing of seven electronic components including the electronic component 12a as illustrated in FIG. 6. As the resin 90a and the resin 90b, for example, a typical material for the sealing of electronic components and so on, such as epoxy resin or the like, can be used.

The shield 20a is an electromagnetic shield formed so as to cover the side surfaces of the substrate 10a and a surface of the resin 90a. Side electrodes are provided on at least two (here, three) side surfaces of the four side surfaces that form the rectangular shape of the substrate 10a as part of the shield 20a. In the plan view of the substrate 10a in FIG. 6, a side surface 41a on the upper side in the diagram is a first side surface. A side electrode 21a of the shield 20a is provided on part of the side surface 41a (in the right portion in the diagram of FIG. 6), a side electrode 23a of the shield 20a is provided on part of a side surface 43a (in the right portion in the diagram of FIG. 6), and a side electrode 24a of the shield 20a is provided on a side surface 44a. Further, as part of the shield 20a, the module 1a includes an electrode wall 80a that extends to the opposite side of the other main surface 15a of the substrate 10a (that is, upward) from the one main surface 14a between the electronic component 11a and the electronic component 12a in a plan view of the substrate 10a. The electrode wall 80a is coupled to at least one side electrode of the side electrode 21a provided on the side surface 41a and a side electrode 22b provided on the side surface 42a. Here, the electrode wall 80a is electrically coupled to the side electrode 21a. The electrode wall 80a may be electrically coupled to both of the side electrodes 21a and 22b. Further, when the substrate 10a is seen in a plan view, the electrode wall 80a extends to reach at least one side surface (here, the side surfaces 41a and 43a) of the at least two side surfaces and is coupled to the side electrodes 21a and 23a provided on the side surfaces 41a and 43a.

The shield 20b is an electromagnetic shield formed so as to cover the side surfaces of the substrate 10a and a surface of the resin 90b. Side electrodes are provided on at least two (here, three) side surfaces included in the four side surfaces that form the rectangular shape of the substrate 10a as part of the shield 20b. In the plan view of the substrate 10a in FIG. 6, the side surface 42a on the left side in the diagram is a second side surface. The side electrode 21b of the shield 20b is provided on part of the side surface 41a (in the left portion in the diagram of FIG. 6), the side electrode 23b of the shield 20b is provided on part of the side surface 43a (in the left portion in the diagram of FIG. 6), and the side electrode 22b of the shield 20b is provided on the side surface 42a. Further, as part of the shield 20b, the module 1a includes an electrode wall 80b that extends to the opposite side of the other main surface 15a of the substrate 10a (that is, upward) from the one main surface 14a between the electronic component 11a and the electronic component 12a in a plan view of the substrate 10a. The electrode wall 80b is coupled to at least one side electrode of the side electrode 21a provided on the side surface 41a and the side electrode 22b provided on the side surface 42a. Here, the electrode wall 80b is electrically coupled to the side electrode 22b. The electrode wall 80b may be electrically coupled to both of the side electrodes 21a and 22b. Further, when the substrate 10a is seen in a plan view, the electrode wall 80b extends to reach at least one side surface (here, the side surfaces 41a and 43a) of the at least two side surfaces and is coupled to the side electrodes 21b and 23b provided on the side surfaces 41a and 43a.

The shields 20a and 20b interrupt unwanted electromagnetic waves for the plurality of electronic components mounted on the substrate 10a and unwanted emissions caused from the plurality of electronic components, and the like. Further, similar to the shield 20, the shields 20a and 20b each have a function of dissipating the heat caused by heat-producing components, such as the electronic components 11a and 12a.

The shields 20a and 20b are provided so as to cover a certain region on the substrate 10a so as to function as an electromagnetic shield, but if used as a heat dissipation member, the shields 20a and 20b need not necessarily be provided so as to cover the certain region on the substrate 10a. Specifically, the shields 20a and 20b need not necessarily be provided above the substrate 10a (on the side of the one main surface 14a) or the substrate 10a may include a side surface where the shields 20a and 20b are not provided. For example, it is just needed for side electrodes to be provided on at least two side surfaces of the plurality of side surfaces that form the polygonal shape (herein, the rectangular shape) of the substrate. For example, the side electrodes 21a and 23a and the side electrodes 21b and 23b are just needed to be provided on the side surfaces 41a and 43a.

Conductor films 31a, 32a, and 34a are provided on the substrate 10a. Specifically, the conductor films 31a, 32a, and 34a are provided on the one main surface 14a of the substrate 10a. Although another conductor film is provided on the one main surface 14a of the substrate 10a in addition to the conductor films 31a, 32a, and 34a, the conductor films 31a, 32a, and 34a are described as focuses of attention in the present embodiment.

The conductor film 31a is a first conductor film coupled to the electronic component 11a. The conductor film 32a is a second conductor film coupled to the electronic component 12a. The conductor film 34a is a fourth conductor film that is coupled to at least one of the electronic component 11a and the electronic component 12a between the electronic component 11a and the electronic component 12a in a plan view of the substrate 10a. In the present embodiment, the conductor film 34a is coupled to both of the electronic component 11a and the electronic component 12a.

The conductor film 31a extends to reach the side surface 41a of the four side surfaces to be coupled to the side electrode 21a provided on the side surface 41a. Specifically, as illustrated in FIG. 6, the conductor film 31a extends on the one main surface 14a to reach the side surface 41a. The conductor film 32a extends to reach the side surface 42a of the four side surfaces, which is different from the side surface 41a, to be coupled to the side electrode 22b provided on the side surface 42a. Specifically, as illustrated in FIG. 6, the conductor film 32a extends on the one main surface 14a to reach the side surface 42a. The conductor film 34a is coupled to the electrode walls 80a and 80b. Further, the conductor film 34a is, for example, extends on the one main surface 14a to reach the side surfaces 41a and 43a to be coupled to the side electrodes 21a and 23a and the side electrodes 21b and 23b provided on the side surfaces 41a and 43a.

The electrode wall 80a is coupled to the side electrodes 21a and 23a and the electrode wall 80b is coupled to the side electrodes 21b and 23b while the electrode walls 80a and 80b serve as part of the shields 20a and 20b in the present embodiment. That is, the electrode walls 80a and 80b serve as heat dissipation members. The electrode walls 80a and 80b as such heat dissipation members are provided in a central portion of the substrate 10a in a plan view of the substrate 10a and are coupled to the conductor film 34a coupled to at least one (here, both) of the electronic components 11a and 12a. Thus, the heat dissipation path for the heat caused by the electronic components 11a and 12a can be provided by the electrode walls 80a and 80b also in the central portion where heat can persist more easily in comparison with the end portions of the substrate 10a and thus, the heat dissipation properties of the module 1a can be further enhanced.

In addition, the electrode walls 80a and 80b are coupled to a via conductor 61a whose one end reaches the other main surface 15a of the substrate 10a. For example, the electrode walls 80a and 80b may be coupled to the via conductor 61a directly or with another configuration (e.g. the conductor film 34a) interposed therebetween. Further, in particular, the electrode wall 80b is coupled to the side electrode 22b provided on the side surface 42a with a roof portion of the shield 20b (a top surface portion of the shield 20b that couples the side electrode 22b and the electrode wall 80b) interposed therebetween.

The via conductor 61a reaches the other main surface 15a of the substrate 10a and can thus be brought into contact or coupled to a heat dissipation member that is low in thermal resistance and favorable in heat dissipation on the other main surface 15a. Thus, the heat dissipation properties of the electrode walls 80a and 80b (that is, the shields 20a and 20b) coupled to the via conductor 61a can be enhanced and the heat dissipation properties of the module 1a can be enhanced even in the central portion where heat can persist more easily in comparison with the end portions of the substrate 10a and the electrode walls 80a and 80b are present. Further, the electrode wall 80b coupled to the via conductor 61a is coupled to the side electrode 22b and thus, part of the heat dissipated from the electrode 32a to the side electrode 22b can be dissipated through the electrode wall 80b and the via conductor 61a, and the heat dissipation properties of the module 1a can be further enhanced.

The heat caused by the electronic component 11a is dissipated from the side electrode 21a provided on the side surface 41a through the conductor film 31a coupled to the electronic component 11a, and the heat caused by the electronic component 12a is dissipated from the side electrode 22b provided on the side surface 42a through the conductor film 32a coupled to the electronic component 12a. Thus, similar to the first embodiment, by making the heat dissipation paths of the heat caused in the electronic component 11a and the electronic component 12a different into the path to the side surface 41a and the path to the side surface 42a, the heat can be dispersed in a plurality of positions and dissipated and accordingly, the heat dissipation properties can be further enhanced in comparison with a case where the heat is dissipated collectively in one position.

Other Embodiments

Although the module according to the present disclosure is described above with reference to the embodiments, the present disclosure is not limited to the above-described embodiments. The present disclosure also encompasses other embodiments achieved by combining given components in the above-described embodiments, variations obtained by adding various changes that those skilled in the art can conceive to the above-described embodiments without deviating from the gist of the present disclosure, and various devices that each include the module according to the present disclosure.

For example, in the above-described embodiments, the conductor films 31 and 31a extend on the one main surfaces 14 and 14a to reach the side surfaces 41 and 41a, and the conductor films 32 and 32a extend on the one main surfaces 14 and 14a to reach the side surfaces 42 and 42a, but the conductor films 31, 31a, 32, and 32a are not limited to this. For example, the conductor films 31 and 31a may extend on the inner layers of the substrates 10 and 10a to reach the side surfaces 41 and 41a, and the conductor films 32 and 32a may extend on the inner layers of the substrates 10 and 10a to reach the side surfaces 42 and 42a.

Further, for example, in the above-described embodiments, the mounting land 51 that does not overlap the via conductor whose one end reaches the other main surface 15 of the substrate 10 in a plan view and is coupled to the conductor film 31 on the one main surface 14 is provided on the one main surface 14, but the mounting land 51 need not necessarily be provided.

Further, for example, in the above-described embodiments, the substrates 10 and 10a are each a laminated substrate including a plurality of layers, but the substrates 10 and 10a need not necessarily each be a laminated substrate.

Further, for example, in the above-described embodiments, the mounting land 52 that is coupled to the plurality of via conductors 53 to 56 whose one ends reach the other main surface 15 of the substrate 10 and is coupled to the conductor film 32 on the one main surface 14 is provided on the one main surface 14, but the mounting land 52 need not necessarily be provided.

Further, for example, in the above-described embodiments, the electronic component 13 is a passive component, but the electronic component 13 need not necessarily be a passive component.

Further, for example, in the above-described embodiments, the electronic component 13 is coupled to at least one of the conductor film 31 and the conductor film 32, but the electronic component 13 need not necessarily be coupled to any of the conductor film 31 and the conductor film 32.

Further, for example, in the above-described embodiments, the module 1 includes the electronic component 13, but the module 1 need not necessarily include the electronic component 13.

Further, for example, in the above-described embodiments, the power supply line 70 is coupled to the via conductors 71 to 77 whose one ends reach the other main surface 15 of the substrate 10, but the power supply line 70 need not necessarily be coupled to the via conductors 71 to 77.

Further, for example, in the above-described embodiments, the electrode walls 80a and 80b are coupled to the via conductor 61a, but the electrode walls 80a and 80b need not necessarily be coupled to the via conductor 61a.

Further, for example, in the above-described embodiments, the electrode walls 80a and 80b are coupled to the conductor film 34a, but the electrode walls 80a and 80b need not necessarily be coupled to the conductor film 34a.

Further, for example, in the above-described embodiments, the module 1a includes the electrode walls 80a and 80b, but the module 1a need not necessarily include the electrode walls 80a and 80b.

Further, for example, in the above-described embodiments, the via conductor whose one end reaches the other main surface 15 of the substrate 10 includes a via conductor larger in diameter than the other via conductors that belong to the plurality of via conductors provided in the substrate 10, but such a via conductor need not necessarily be included.

Further, for example, in the above-described embodiments, the electronic components 11, 11a, 12, and 12a are each at least one of an amplification component and a regulator, but the electronic components 11, 11a, 12, and 12a need not necessarily each be any electronic component of an amplification component and a regulator.

Further, for example, in the above-described embodiments, the plurality of electronic components undergo resin sealing, but the resin sealing need not necessarily be performed.

The present disclosure can be widely used for hardware for which heat dissipation properties are required.

1, 1a MODULE
10, 10a SUBSTRATE
11, 11a ELECTRONIC COMPONENT (FIRST ELECTRONIC COMPONENT)
12, 12a ELECTRONIC COMPONENT (SECOND ELECTRONIC COMPONENT)
13 ELECTRONIC COMPONENT (THIRD ELECTRONIC COMPONENT)
14, 14a ONE MAIN SURFACE
15, 15a OTHER MAIN SURFACE
20, 20a, 20b SHIELD
21, 21a, 21b, 22, 22b, 23, 23a, 23b, 24a SIDE ELECTRODE
31, 31a CONDUCTOR FILM (FIRST CONDUCTOR FILM)
32, 32a CONDUCTOR FILM (SECOND CONDUCTOR FILM)
33 CONDUCTOR FILM (THIRD CONDUCTOR FILM)
34a CONDUCTOR FILM (FOURTH CONDUCTOR FILM)
35 CONDUCTOR FILM (FIFTH CONDUCTOR FILM)
41 SIDE SURFACE (FIRST SIDE SURFACE)
42 SIDE SURFACE (SECOND SIDE SURFACE)
43 SIDE SURFACE (THIRD SIDE SURFACE)
44a SIDE SURFACE
51, 52 MOUNTING LAND
53, 54, 55, 56 VIA CONDUCTOR (FIRST VIA CONDUCTOR)
61 VIA CONDUCTOR
61a VIA CONDUCTOR (THIRD VIA CONDUCTOR)
71, 72, 73, 74, 75, 76, 77 VIA CONDUCTOR (SECOND VIA CONDUCTOR)
78, 79 VIA CONDUCTOR (FOURTH VIA CONDUCTOR)
70 POWER SUPPLY LINE
80a, 80b ELECTRODE WALL
90 RESIN

The invention claimed is:

1. A module comprising:
a substrate having a polygonal shape in a plan view;
a first electronic component and a second electronic component, the first electronic component and the second electronic component being mounted on one main surface of the substrate; and
side electrodes provided on a plurality of side surfaces forming the polygonal shape of the substrate, wherein
a first conductor film coupled to the first electronic component and a second conductor film coupled to the second electronic component are provided on the substrate,
the first conductor film extends to reach a first side surface of the plurality of side surfaces to be coupled to the side electrodes provided on the first side surface, and
the second conductor film extends to reach a second side surface of the plurality of side surfaces to be coupled to the side electrodes provided on the second side surface, the second side surface being different from the first side surface,
wherein at least one mounting land is provided on the one main surface, at least one of the first electronic component or the second electronic component being mounted on the at least one mounting land,
the at least one mounting land includes a mounting land not overlapping a via conductor in the plan view, one end of the via conductor reaching another main surface of the substrate, and
the mounting land is coupled to the first conductor film or the second conductor film on the one main surface, the first conductor film or the second conductor film being coupled to the at least one of the first electronic component or the second electronic component.

2. The module according to claim 1, wherein the first conductor film extends on the one main surface to reach the first side surface, and the second conductor film extends on the one main surface to reach the second side surface.

3. The module according to claim 2, wherein
the substrate is a laminated substrate including a plurality of layers, and
a third conductor film is provided on at least one inner layer of the plurality of layers in the substrate, the third conductor film extending to reach the plurality of side surfaces to be coupled to the side electrodes provided on the plurality of side surfaces.

4. The module according to claim 2, wherein
the at least one mounting land is provided on the one main surface, at least one of the first electronic component or the second electronic component being mounted on the at least one mounting land,
the at least one mounting land includes a mounting land coupled to a first via conductor, one end of the first via conductor reaching the other main surface of the substrate, and
the mounting land is coupled to the first conductor film or the second conductor film on the one main surface, the first conductor film or the second conductor film being coupled to the at least one of the first electronic component or the second electronic component.

5. The module according to claim 1, further comprising a third electronic component mounted between the first electronic component and the second electronic component on the one main surface in the plan view.

6. The module according to claim 5, wherein
the third electronic component is a passive component.

7. The module according to claim 5, wherein
the third electronic component is coupled to at least one of the first conductor film and the second conductor film.

8. The module according to claim 1, further comprising an electrode wall
extending from the one main surface to an opposite side of the other main surface of the substrate between the first electronic component and the second electronic component in the plan view,
wherein the electrode wall is coupled to at least one side electrode of the side electrodes provided on the first side surface and the side electrodes provided on the second side surface to be coupled to a third via conductor, one end of the third via conductor reaching the other main surface of the substrate.

9. The module according to claim 1, further comprising an electrode wall extending from the one main surface to an opposite side of the other main surface of the substrate between the first electronic component and the second electronic component in the plan view,
wherein the electrode wall extends to reach at least one side surface of the plurality of side surfaces to be coupled to the side electrodes provided on the at least one side surface, a fourth conductor film is provided on the one main surface, the fourth conductor film being coupled to at least one of the first electronic component and the second electronic component between the first electronic component and the second electronic component in the plan view, and the fourth conductor film is coupled to the electrode wall.

10. A module comprising:

a substrate having a polygonal shape in a plan view; a first electronic component mounted on one main surface of the substrate; and side electrodes provided on a plurality of side surfaces forming the polygonal shape of the substrate, wherein a first conductor film and a fifth conductor film are provided on the substrate, each of the first conductor film and the fifth conductor film being coupled to the first electronic component, the first conductor film extends to reach a first side surface of the plurality of side surfaces to be coupled to the side electrodes provided on the first side surface, and the fifth conductor film extends to reach a third side surface of the plurality of side surfaces the third side surface being different from the first side surface.

11. The module according to claim 10, wherein the first conductor film extends on the one main surface to reach the first side surface, and the fifth conductor film extends on the one main surface to reach the third side surface.

12. The module according to claim 11, wherein at least one mounting land is provided on the one main surface, the first electronic component being mounted on the at least one mounting land, the at least one mounting land includes a mounting land not coupled to a via conductor, one end of the via conductor reaching another main surface of the substrate, and the mounting land is coupled to the first conductor film or the fifth conductor film on the one main surface, the first conductor film or the fifth conductor film being coupled to the first electronic component.

13. The module according to claim 11, wherein the substrate is a laminated substrate including a plurality of layers, and a third conductor film is provided on at least one inner layer of the plurality of layers in the substrate, the third conductor film extending to reach the plurality of side surfaces to be coupled to the side electrodes provided on the plurality of side surfaces.

14. The module according to claim 11, wherein at least one mounting land is provided on the one main surface, the first electronic component being mounted on the at least one mounting land, the at least one mounting land includes a mounting land coupled to a first via conductor, one end of the first via conductor reaching the other main surface of the substrate, and the mounting land is coupled to the first conductor film or the fifth conductor film on the one main surface, the first conductor film or the fifth conductor film being coupled to the first electronic component.

15. The module according to claim 1, wherein the first electronic component is one of an amplification component and a regulator.

16. The module according to claim 1, wherein the substrate is a laminated substrate including a plurality of layers, and a third conductor film is provided on at least one inner layer of the plurality of layers in the substrate, the third conductor film extending to reach the plurality of side surfaces to be coupled to the side electrodes provided on the plurality of side surfaces.

17. The module according to claim 1, wherein at least one mounting land is provided on the one main surface, at least one electronic component of the first electronic component and the second electronic component being mounted on the at least one mounting land, the at least one mounting land includes a mounting land coupled to a first via conductor, one end of the first via conductor reaching the other main surface of the substrate, and the mounting land is coupled to the first conductor film or the second conductor film on the one main surface, the first conductor film or the second conductor film being coupled to the at least one electronic component.

18. The module according to claim 3, wherein at least one mounting land is provided on the one main surface, at least one electronic component of the first electronic component and the second electronic component being mounted on the at least one mounting land, the at least one mounting land includes a mounting land coupled to a first via conductor, one end of the first via conductor reaching the other main surface of the substrate, and the mounting land is coupled to the first conductor film or the second conductor film on the one main surface, the first conductor film or the second conductor film being coupled to the at least one electronic component.

19. The module according to claim 2, further comprising a third electronic component mounted between the first electronic component and the second electronic component on the one main surface in the plan view.

* * * * *